United States Patent
Rice

(10) Patent No.: US 7,742,265 B2
(45) Date of Patent: Jun. 22, 2010

(54) HIGH VOLTAGE POWER SUPPLY CLAMP CIRCUITRY FOR ELECTROSTATIC DISCHARGE (ESD) PROTECTION

(75) Inventor: David R. Rice, Phoenix, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 769 days.

(21) Appl. No.: 11/145,903

(22) Filed: Jun. 6, 2005

(65) Prior Publication Data
US 2006/0274466 A1 Dec. 7, 2006

(51) Int. Cl.
H02H 9/00 (2006.01)
(52) U.S. Cl. .......................................... 361/56
(58) Field of Classification Search ............... 361/56
See application file for complete search history.

(56) References Cited

U.S. PATENT DOCUMENTS

| | | | |
|---|---|---|---|
| 5,717,560 | A | 2/1998 | Doyle et al. |
| 5,907,464 | A | 5/1999 | Maloney et al. |
| 5,956,219 | A | 9/1999 | Maloney |
| 6,008,970 | A | 12/1999 | Maloney et al. |
| 6,194,917 | B1 * | 2/2001 | Deng .................... 327/12 |
| 6,268,993 | B1 * | 7/2001 | Anderson ............... 361/111 |
| 6,560,081 | B1 | 5/2003 | Vashchenko et al. |
| 6,577,481 | B2 | 6/2003 | Steinhoff et al. |
| 6,690,555 | B1 | 2/2004 | Pasqualini |
| 6,744,610 | B2 | 6/2004 | Chang et al. |
| 6,747,501 | B2 | 6/2004 | Ker et al. |
| 6,760,209 | B1 | 7/2004 | Sharpe-Geisler |

(Continued)

OTHER PUBLICATIONS

Sedra, Adel, and Kenneth Smith. Microelectronic Circuits. 4th ed.. New York: Oxford University Press, 1998. Print.*

(Continued)

*Primary Examiner*—Stephen W Jackson
*Assistant Examiner*—Scott Bauer
(74) *Attorney, Agent, or Firm*—Meyertons Hood Kivlin Kowert & Goetzel, P.C.; Jeffrey C. Hood

(57) ABSTRACT

In one embodiment, an ESD protection circuit comprises a switchable current sinking circuit connected to a positive ESD clamp rail voltage, which may be a power supply voltage, and a single trigger control circuit coupled to a control connection of the switchable current sinking circuit. The single trigger control circuit may be configured to couple the control connection of the switchable current sinking circuit to a negative ESD clamp rail voltage, which may be signal ground, during an ESD event occurring on the positive ESD clamp rail connection. In one embodiment, the switchable current sinking circuit is capable of sinking large amounts of current, and the ESD protection circuit is tolerant of rail voltages that exceed the breakdown voltage of semiconductor devices used in constructing the ESD circuit. In one embodiment, the single trigger control circuit is implemented with a single n-well, thereby minimizing the amount of required silicon area during fabrication of the ESD protection circuit.

28 Claims, 6 Drawing Sheets

U.S. PATENT DOCUMENTS

| | | |
|---|---|---|
| 6,768,176 B1 | 7/2004 | Litfin |
| 6,788,507 B2 | 9/2004 | Chen et al. |
| 6,800,906 B2 | 10/2004 | Cheng |
| 6,829,126 B2 | 12/2004 | Lee et al. |
| 6,838,775 B2 | 1/2005 | Takahashi |
| 6,844,595 B2 | 1/2005 | Chen |
| 6,864,536 B2 | 3/2005 | Lin et al. |
| 6,876,529 B2 | 4/2005 | Li |
| 7,180,331 B2 * | 2/2007 | Gosmain et al. .............. 326/83 |
| 7,230,806 B2 * | 6/2007 | Poon et al. .................... 361/56 |

OTHER PUBLICATIONS

Timothy J. Maloney, Steven S. Poon, and Lawrence T. Clark, "Methods for Designing Low-leakage Power Supply Clamps," 2003, EOS/ESD Symposium, 7 pages.

* cited by examiner

HIGH VOLTAGE POWER SUPPLY CLAMP CIRCUITRY FOR ELECTROSTATIC DISCHARGE (ESD) PROTECTION

BACKGROUND OF THE INVENTION

1. Field of the Invention

This invention relates generally to the field of integrated circuit design and, more particularly, to the design of protection circuitry for providing protection against damaging effects of Electrostatic Discharge (ESD).

2. Description of the Related Art

Integrated circuits (ICs) are typically manufactured with external connections—most commonly pins—for coupling to external devices, systems, signals and/or power supply voltages. More recently, IC design and manufacturing has been trending towards an increase in the density of internal components, most commonly transistors and device interconnects, with a concurrent decrease in the power supply voltage levels used in operating the ICs. As IC devices increase in density and operating supply voltage levels decrease, the IC devices may become more sensitive to the effects of electrostatic discharge (ESD).

ESD many times originates from build up of static charge near the IC or on a human handling the IC, leading to extremely high voltages developed near the IC, and typically results in an electrical discharge of very high current for a short duration. Therefore, ESD poses a serious problem for semiconductor devices as it can potentially lead to malfunction and/or the destruction of an entire IC. In addition, the physical dimensions of circuit elements in many ICs, for example in microprocessors, have seen a decrease with each new generation of manufacturing process. Although smaller dimensions lead to an increase in IC operating speeds, they also have an adverse impact by increasing the sensitivity of circuit elements, such as field effect transistors (FETs), to high electric fields. One technique employed in overcoming this increased sensitivity has been to reduce the operating voltage of an IC. However, as supply voltages are scaled down (from 5.0 volts, to 3.3 volts, to 2.5, to 1.8 volts, for example), there is typically a need to maintain backward compatibility with the higher voltage requirements of older ICs.

In order to maintain compatibility with previous generations of semiconductor products and devices, it has been necessary to provide ICs with interface circuits that are interoperable with older generation ICs requiring higher supply voltages. One result of this has been the practice of designing ICs having a core operated using a first power supply voltage, and Input/Output (I/O) circuitry, typically around the physical periphery of the IC, operated using a higher power supply voltage. Since ESD events often occur across the silicon circuits attached to the package terminals, or pins, of an IC, circuit designers have concentrated their efforts on developing adequate protection mechanisms for these sensitive circuits. Often the design of ESD protection circuits has to satisfy high performance requirements. For example, one of the primary industry standards for measuring ESD robustness (MIL-STD-883C method 3015.7 Notice 8 (1989), and the subsequent Human Body Model (HBM) standard No. 5.1 (1993) from the EOS/ESD Association) requires ESD zapping for what can be a large number of pin and power supply combinations.

Generally formulated, protection against effects of ESD requires sensing the fast rate of voltage change that might affect an integrated circuit component, or an entire chip, resulting from an ESD pulse. The pins that require the ESD protection must generally be tolerant to voltages above the highest voltage tolerance of the typical FETs used in the fabrication process. Trigger circuits that may be used to turn on a clamp in response to any incoming ESD pulse would therefore have to be high voltage tolerant. In the past, ESD protection circuits have had difficulty meeting these stringent requirements while maintaining adequate noise immunity and without increasing the required silicon area.

For example, a clamp circuit capable of providing ESD protection to a high voltage supply connection disclosed in U.S. Pat. No. 5,956,219 contains two trigger circuits, which increases the silicon area required for the 5V tolerant clamping functionality. Other solutions with only one trigger circuit generally require PMOS devices in separate n-wells, which still leads to increased silicon area requirements. Another example is an electrostatic discharge protection circuit adapted for use in low voltage CMOS processes presented in U.S. Pat. No. 5,907,464, which contains a clamp circuit between a higher 5V tolerant rail and a 3V power supply. One disadvantage of this implementation when compared to the clamp circuit disclosed in U.S. Pat. No. 5,956,219 is that the clamp path of the clamp circuit has a greater resistance. The increased clamp path resistance is due to the energy from the ESD pulse having to pass through the FET clamp from the 5V rail to the 3V rail, then from the 3V rail to ground.

Other corresponding issues related to the prior art will become apparent to one skilled in the art after comparing such prior art with the present invention as described herein.

SUMMARY OF THE INVENTION

In one set of embodiments, an improved high voltage (for example, 5V) tolerant ESD protection circuit comprises a switchable current sinking circuit connected to a positive ESD clamp rail voltage—which may be a power supply voltage—and a single trigger control circuit coupled to a control connection of the switchable current sinking circuit. The single trigger control circuit may be configured to couple the control connection of the switchable current sinking circuit to a negative ESD clamp rail voltage—which may be signal ground—during an ESD event occurring on the positive ESD clamp rail connection. In one embodiment, the single trigger control circuit is implemented with a single n-well, thereby minimizing the amount of required silicon area during fabrication of the ESD protection circuit. The ESD protection circuit may further comprise a voltage divider circuit configured to generate an intermediate voltage level at an intermediate node between the positive ESD clamp rail voltage and the negative ESD clamp rail voltage, thereby increasing the tolerance of the ESD protection circuit to voltages higher than the breakdown voltage of the devices used in the ESD protection circuit.

In one set of embodiments, the switchable current sinking circuit comprises series connected PMOS transistors coupled between the positive ESD clamp rail voltage and the negative ESD clamp rail voltage for providing a discharge path during an ESD event that may occur on the positive ESD clamp rail connection. The single trigger control circuit may comprise a single RC trigger coupled to the input of a first inverter. The output of the first inverter may be coupled to the input of a second inverter, with the output of the second inverter coupled to the gate of the transistor of the series coupled PMOS transistors that is electrically adjacent to the positive ESD clamp rail voltage. The output of the second inverter may also be coupled to the input of a level shifting inverter comprising a couple of cascaded PMOS transistors. The output of the level shifting inverter may be coupled to the gate of a pull down NMOS device whose drain may be coupled to the gate of the transistor of the series coupled PMOS transistors that is electrically adjacent to the negative ESD clamp rail voltage.

During an ESD event, the positive ESD clamp rail may be rapidly lifted in voltage. In response to the rapidly rising voltage, the RC trigger may operate to keep a low voltage at the input of the first inverter. That low voltage, coupled to the input of the second inverter, may produce a low voltage at the output of the second inverter, which may result in pulling the gate of the transistor of the series coupled PMOS transistors that is electrically adjacent to the positive ESD clamp rail voltage to a voltage level commensurate with the intermediate voltage level generated by the voltage divider circuit. In response, the output of the level shifting inverter, coupled to the gate of the pull down NMOS device, may turn the pull down NMOS device on, pulling the intermediate voltage level node down to the negative ESD clamp rail voltage, thereby lowering the resistance of the series coupled PMOS clamps.

As a result, the gates of the series coupled PMOS transistors may be coupled to the negative ESD clamp rail voltage during an ESD event, with the ESD discharge path through the switchable current sinking circuit capable of sinking substantially large currents. Over a given time period following the ESD event, the RC trigger circuit may operate to charge its capacitor, resulting in the ESD protection circuit re-entering its normal operating mode where the series coupled PMOS transistors are turned off, thereby turning off the switchable current sinking circuit. This turnoff is typically much longer than a typical ESD pulse duration of 100 ns.

Thus, the various embodiments may facilitate the design of effective ESD protection circuits that are tolerant of rail voltages exceeding the breakdown voltage of the transistor devices comprised in the ESD protection circuit, utilizing a single trigger drive circuit comprising a single n-well, thereby minimizing the amount of required silicon area during fabrication of the circuit.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
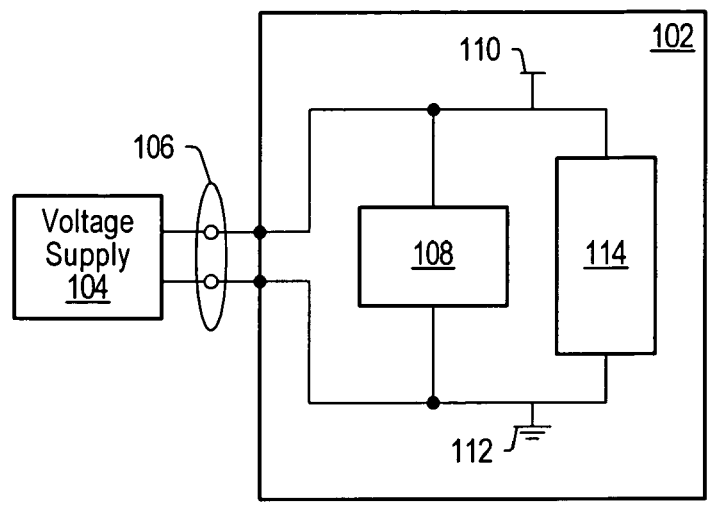
FIG. 1 shows the block diagram of one embodiment of an integrated circuit configured with an externally provided supply voltage and an electrostatic discharge (ESD) protection circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

FIG. 1 shows a block diagram of one embodiment of an integrated circuit (IC) 102 configured to receive an externally provided supply voltage from voltage supply 104 via input terminals 106. As shown in FIG. 1, an electrostatic discharge (ESD) protection circuit 108 may be coupled between internal supply rail 110 and substrate ground 112, and may be configured to protect internal circuit 114 from electrostatic discharge. IC 102 may be any type of integrated circuit that is configured to receive a supply voltage, such as provided by voltage supply 104, including, but not limited to, processors, controllers, memory devices, and application specific integrated circuits (ASIC).

Figure 2:
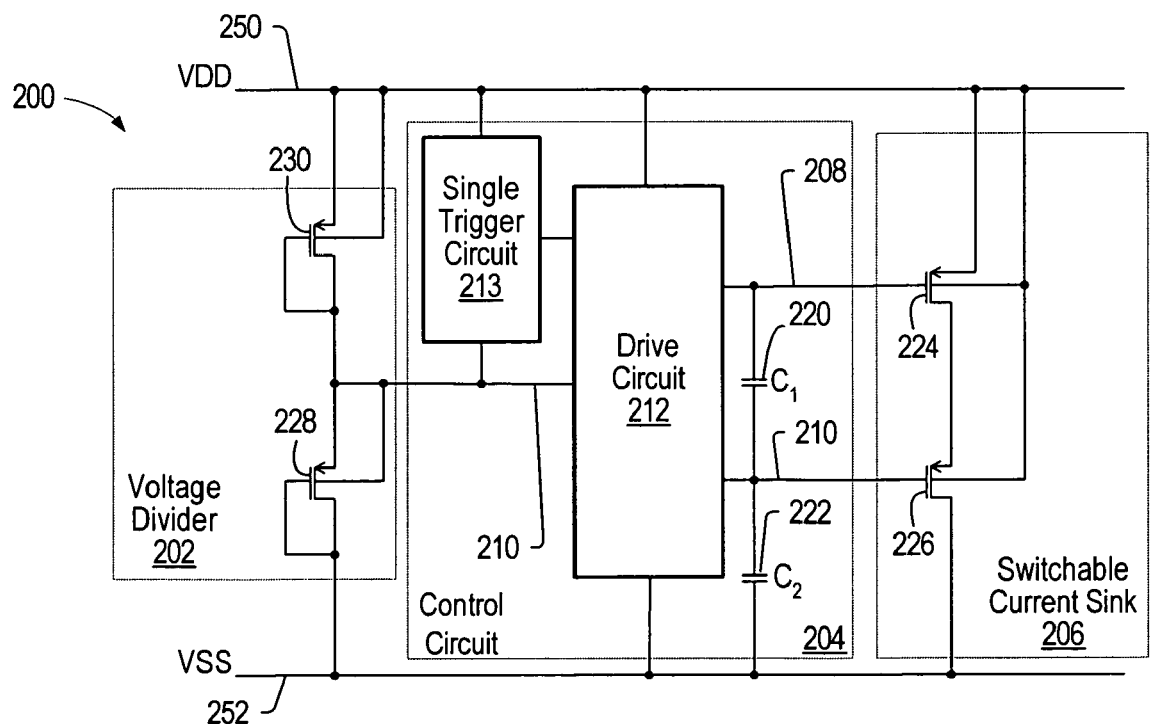
FIG. 2 illustrates the block diagram of one embodiment of an ESD protection circuit configured with a single trigger circuit and a drive circuit.

FIG. 2 illustrates one embodiment of an ESD protection circuit 200, which may be used in the same capacity as ESD protection circuit 108 illustrated in FIG. 1. In one embodiment, protection circuit 200 is implemented using series coupled PMOS transistor devices 224 and 226, and is used to provide protection against ESD events in high-voltage tolerant circuits. Backward compatibility with the higher voltage requirements of older ICs may be a consideration when taking into account the recent trend of designing integrated circuits and systems operating with scaled down supply voltages. Protection circuit 200 may include a switchable current sinking circuit 206, which may be coupled to a control circuit 204 configured to drive switchable current sinking circuit 206 low. As previously mentioned, switchable current sinking circuit 206 may be implemented as series coupled PMOS transistors 224 and 226, which may be configured to form a conductive circuit between an ESD power rail voltage Vdd 250 and ground Vss 252. PMOS transistors 224 and 226 are operable to be switched on to conduct current, or one or both may be switched off to eliminate substantially all current flow, and may be implemented in a common n-well to eliminate a need for contacts at their common node.

Protection circuit 200 may also include a voltage divider circuit 202 configured to reduce a high voltage on Vdd 250 to a smaller voltage appearing on node 210. In one set of embodiments, voltage divider circuit 202 generates conditions more appropriate for long-term exposure on a single transistor gate oxide, thereby increasing the tolerance of the ESD protection circuit to voltages higher than the breakdown voltage of the devices used in the ESD protection circuit. In one embodiment, a combination of a single trigger circuit 213 coupled to a drive circuit 212 is configured to couple transistor gate connections 208 and 210 to Vss 252. Single trigger circuit 213 and drive circuit 212, as configured, may be operable to turn on transistors 224 and 226 in a way conducive to switchable current sinking circuit 206 sinking large amounts of current.

Figure 3A:
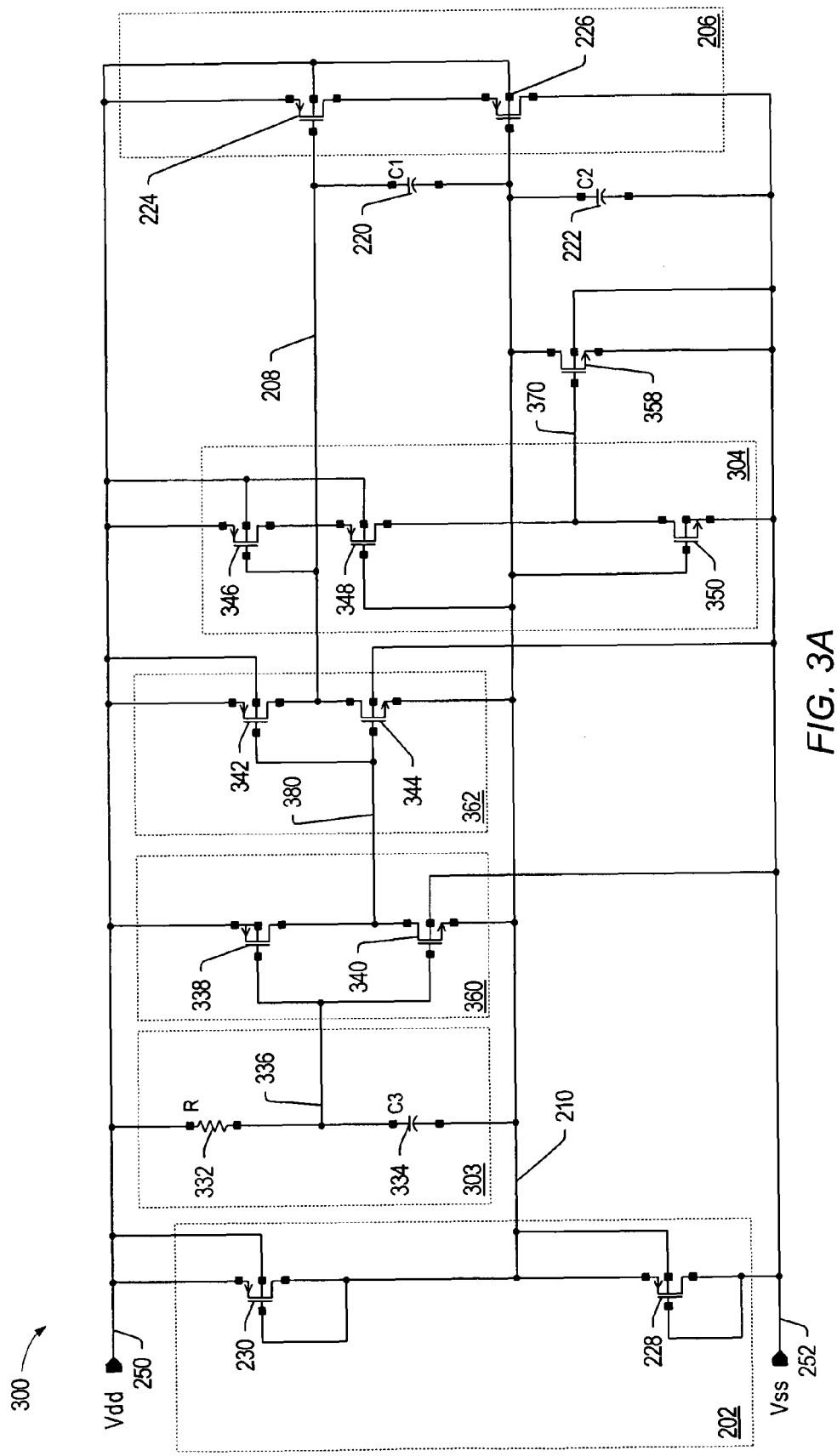
FIG. 3A illustrates the circuit diagram of one embodiment of the ESD protection circuit of FIG. 2.

FIG. 3A illustrates one embodiment of protection circuit 200, configured as a PMOS protection circuit 300 for use in high-voltage tolerant circuits. PMOS protection circuit 300 may include switchable current sinking circuit 206, which may be driven low by control circuit 204 comprising single trigger circuit 213 and drive circuit 212. In the embodiment shown, single trigger circuit comprises an RC trigger circuit 303, and drive circuit 212 comprises inverters 360 and 362, level shifting inverter (LESI) 304, and pull-down device 358. In alternate embodiments, single trigger circuit 213 may or may not be configured as part of control circuit 204, and may instead be coupled to control circuit 204. PMOS protection circuit 300 may also comprise voltage divider circuit 202, which may be configured with PMOS transistor 230 coupled between Vdd 250 and intermediate node 210, and second PMOS transistor 228 coupled between intermediate node 210 and Vss 252, as shown. PMOS transistors 230 and 228 divide the higher voltage from Vdd 250 into a smaller voltage on intermediate node 210, thereby allowing PMOS protection circuit 300 to operate with an increased voltage handling capability.

As previously mentioned, series coupled PMOS transistors 224 and 226 may form a switchable current sinking circuit between Vdd 250 and Vss 252, and may be operated to conduct current when switched on, or to substantially eliminate current flow when switched off. In one embodiment, PMOS transistors 224 and 226 share a common n-well, eliminating the need for contacts at their common node, thereby allowing for minimum spacing between their gate electrodes. While having PMOS transistors 224 and 226 switched off is considered to substantially eliminate current flow through switchable current sinking circuit 206, those skilled in the art will recognize that a very small current flow may exist due to leakage or sub threshold conduction mechanisms. However, in such instances, PMOS transistors 224 and 226 may still be considered to be switched off. A steady state low leakage current may be achieved by turning off one of PMOS transistors 224 and 226 comprised in switchable current sinking circuit 206. In one set of embodiments, PMOS 224, which is electrically adjacent to Vdd 250, is turned off to achieve the steady state low leakage current. Pulling the gate voltage of PMOS 224 up to a level that is substantially coincident with Vdd 250 may result in PMOS 224 being turned off.

In one embodiment, LESI 304 is implemented with cascaded PMOS transistors 346 and 348 and NMOS transistor 316, with the input of LESI 304 coupled to the output of inverter 362. By cascading PMOS transistors 346 and 348 with the output of inverter 362 coupled to the gate of PMOS transistor 346 as shown, LESI 304 is configured to be tolerant of a rail voltage Vdd 250 value up to twice the breakdown voltage of individual transistor devices 346, 348, and 350. For example, if the breakdown voltage of the transistor devices comprised in PMOS protection circuit 300 is 3.3V, Vdd 250 may take on a value of up to 5V, or even 5.5V or 6V. During an ESD event, LESI circuit 304 may be used to pull node 208 to Vss 252.

Figure 3B:
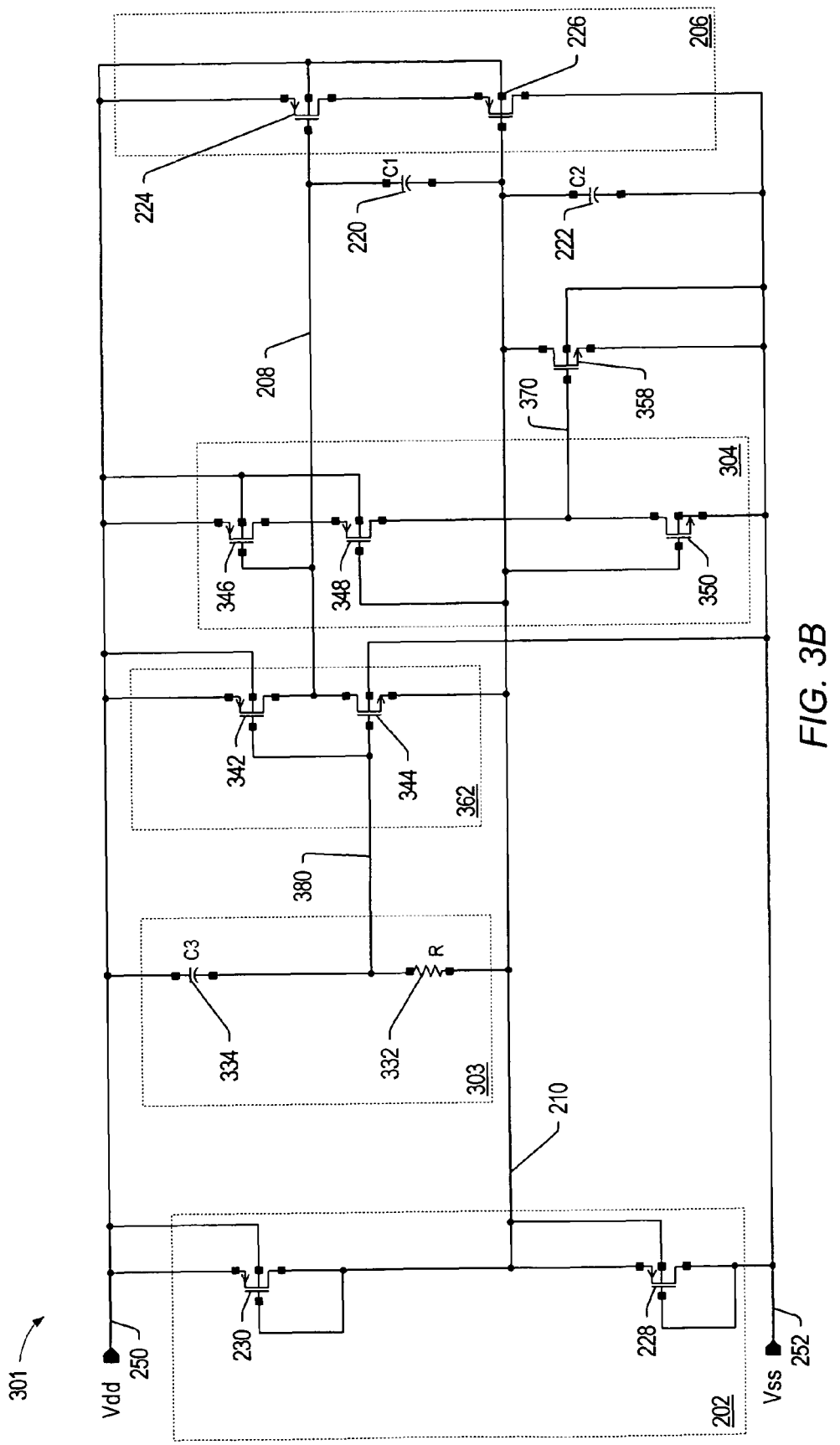
FIG. 3B illustrates the circuit diagram of an alternate embodiment of the ESD protection circuit of FIG. 2.

FIG. 3B illustrates an alternate embodiment of protection circuit 200, configured as a PMOS protection circuit 301 for use in high-voltage tolerant circuits. Protection circuit 301 is based on protection circuit 300, with inverter 360 having been removed, and the respective positions of resistor 332 and capacitor 334 within RC trigger circuit 303 having been reversed. Consequently, RC trigger circuit 303 may be coupled to input node 380 of inverter 362. In one set of embodiments, capacitor 334 may be implemented as a PMOS device with its well tied to Vdd 250, thereby facilitating the implementation of RC trigger circuit 303, inverter 362, LESI 304, and pull-down device 358 with a single n-well.

Functionality of PMOS protection circuit 300 under normal operating conditions, when no ESD event occurs, will now be described. Resistance R 332, comprised in RC trigger circuit 303, operates to bring node 336 to a voltage level substantially equivalent to ESD clamp rail voltage Vdd 250. The high voltage thus established at node 336 turns on NMOS transistor 340, resulting in low voltage at node 380, which is coupled to the gates of transistors 342 and 344. The low voltage at node 380 is then inverted through inverter 362, resulting in a high voltage at node 208. The high voltage at node 208, coupled to the gate of PMOS transistor 224, turns off PMOS transistor 224. Voltage divider 202 operates to bring node 210 to an intermediate voltage level that is lower than Vdd 250, for example a mid-level voltage between positive ESD clamp rail voltage Vdd 250 and negative ESD clamp rail voltage Vss 252. As a result of node 208 also being coupled to the input of LESI 304, the high voltage at node 208 results in node 370 being coupled to Vss 252. The low voltage at node 370 insures that pull-down NMOS transistor 358 is turned off, allowing the voltage at node 210 to remain at the intermediate voltage level, which in turn insures that PMOS transistor 226 is also turned off, resulting in entire switchable current sinking circuit 206 being turned off.

Operation of PMOS protection circuit 301 under normal operating conditions may be described similarly to that of PMOS protection circuit 300, with the exception that in PMOS protection circuit 301, RC trigger circuit 303 operates to bring node 380 to a substantially low voltage level as opposed to a voltage level substantially equivalent to ESD clamp rail voltage Vdd 250. The low voltage at node 380 results in the overall operation of PMOS protection circuit 301 following that of PMOS protection circuit 300.

Functionality of PMOS protection circuit 300 during an ESD event will now be described. During an ESD event, positive ESD clamp rail Vdd 250 may be rapidly lifted in voltage. In response to a rapidly rising voltage at Vdd 250, RC trigger circuit 303 may operate to keep node 336 at a low voltage. The low voltage at node 336 turns on transistor 338, producing a high voltage at node 380, which turns on transistor 344, thereby pulling node 208 to a voltage level commensurate with the intermediate voltage level at node 210. The intermediate voltage at node 208 coupled to LESI 304 results in node 370 rising to a sufficiently high voltage to turn on transistor 358 such that node 210 is pulled to negative ESD clamp rail voltage Vss 252 without a threshold voltage (Vt) drop through transistor 358. Thus, the gates of PMOS transistors 224 and 226 are coupled to Vss 252 during an ESD event, with the ESD discharge path through switchable current sinking circuit 206 capable of sinking substantially large currents. Over a given time period following the ESD event, RC trigger circuit 303 may operate to charge capacitor 334, resulting in PMOS protection circuit 300 re-entering its normal operating mode with PMOS transistors 224 and 226 being turned off, turning off switchable current sinking circuit 206.

Operation of PMOS protection circuit 301 during an ESD event may also be described similarly to that of PMOS protection circuit 300, with the exception that in PMOS protection circuit 301, RC trigger circuit 303 operates to keep node 380 at a substantially high voltage level as opposed to a low voltage level. The high voltage at node 380 results in the overall operation of PMOS protection circuit 301 following that of PMOS protection circuit 300.

Figure 4:
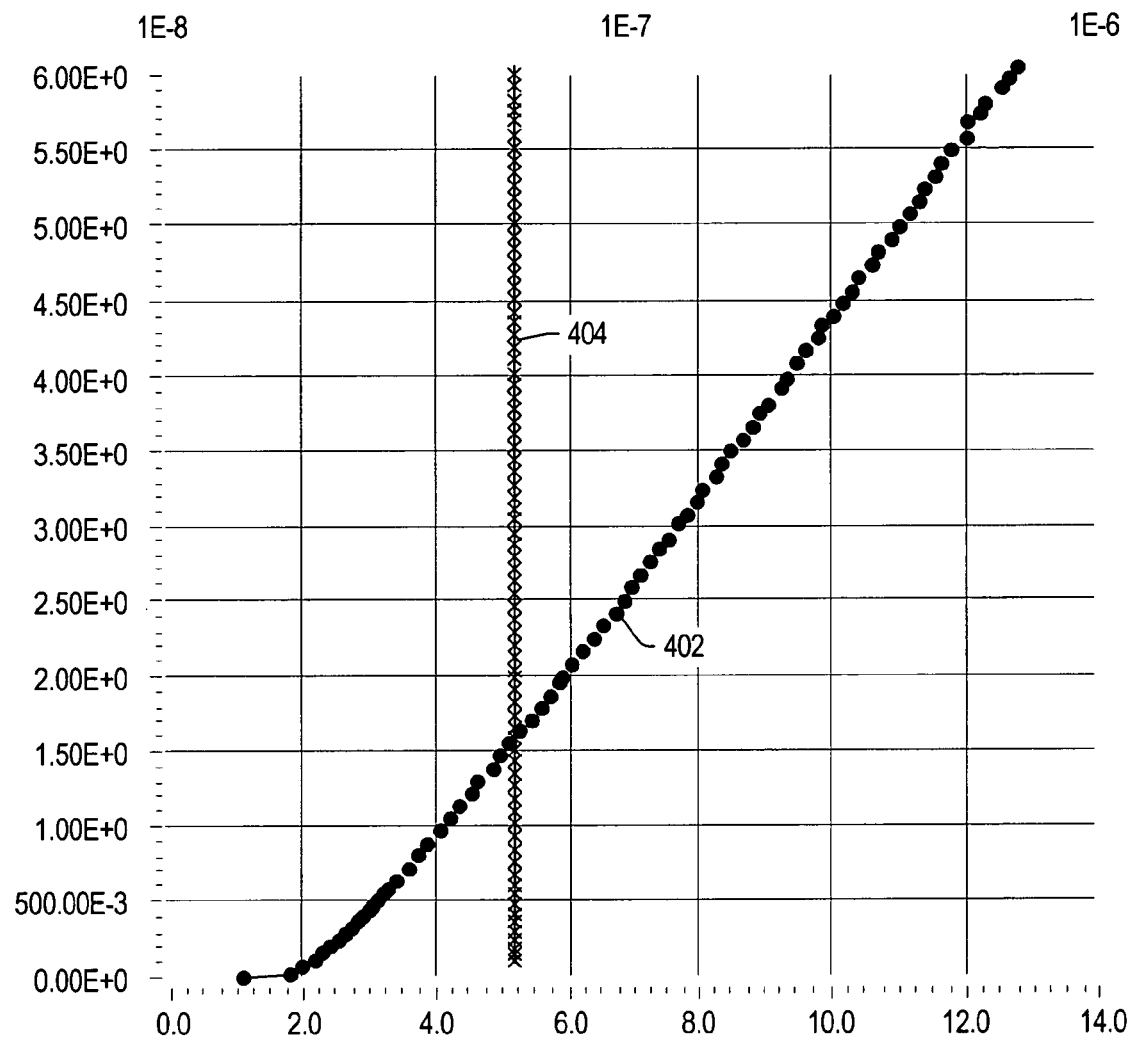
FIG. 4 shows a plot representing transition line pulse (TLP) testing results for a first set of pins that use the ESD protection circuit of FIG. 3.
Figure 5:
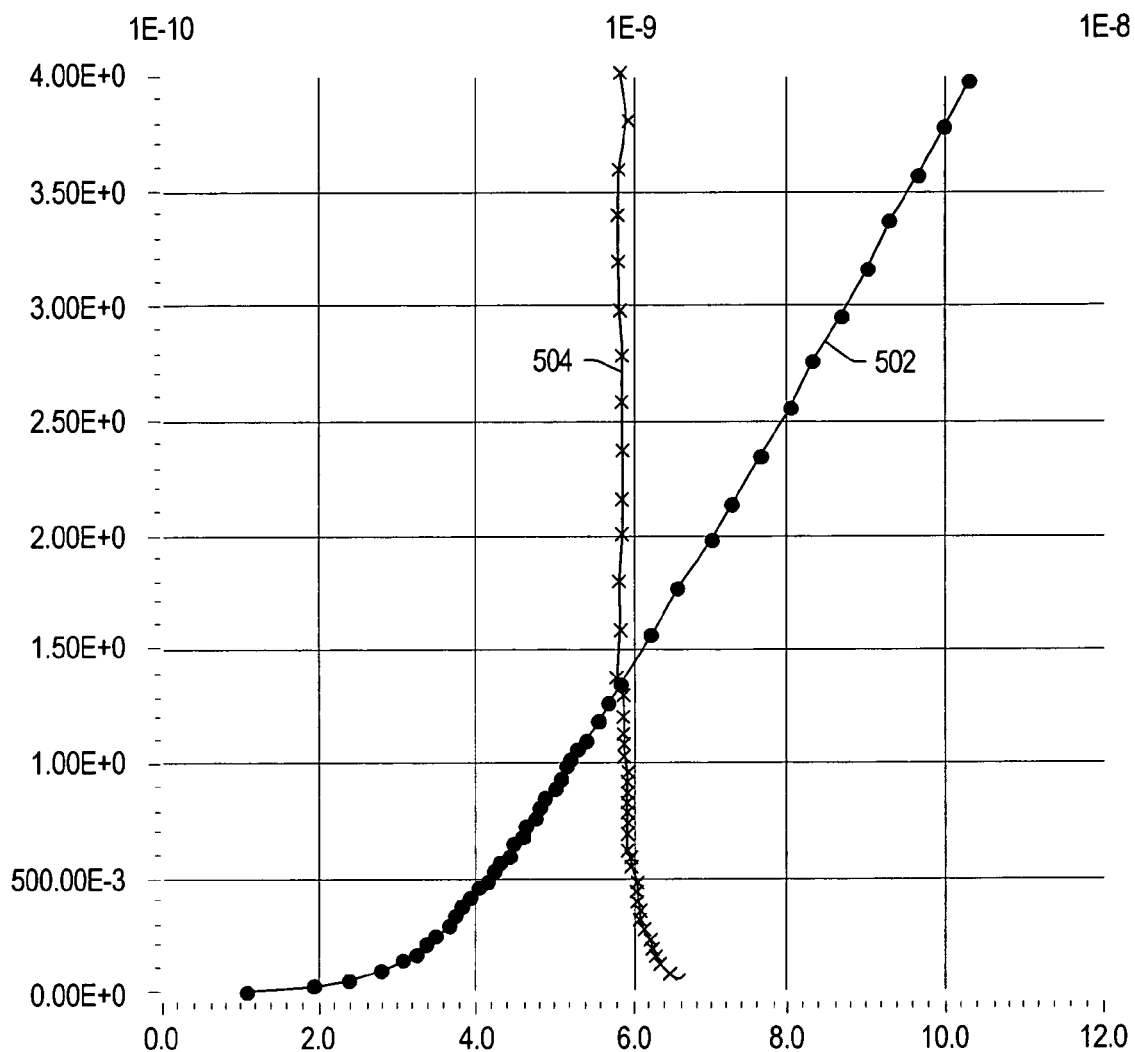
FIG. 5 shows a plot representing TLP testing results for a second set of pins that use the ESD protection circuit of FIG. 3.
Figure 6:
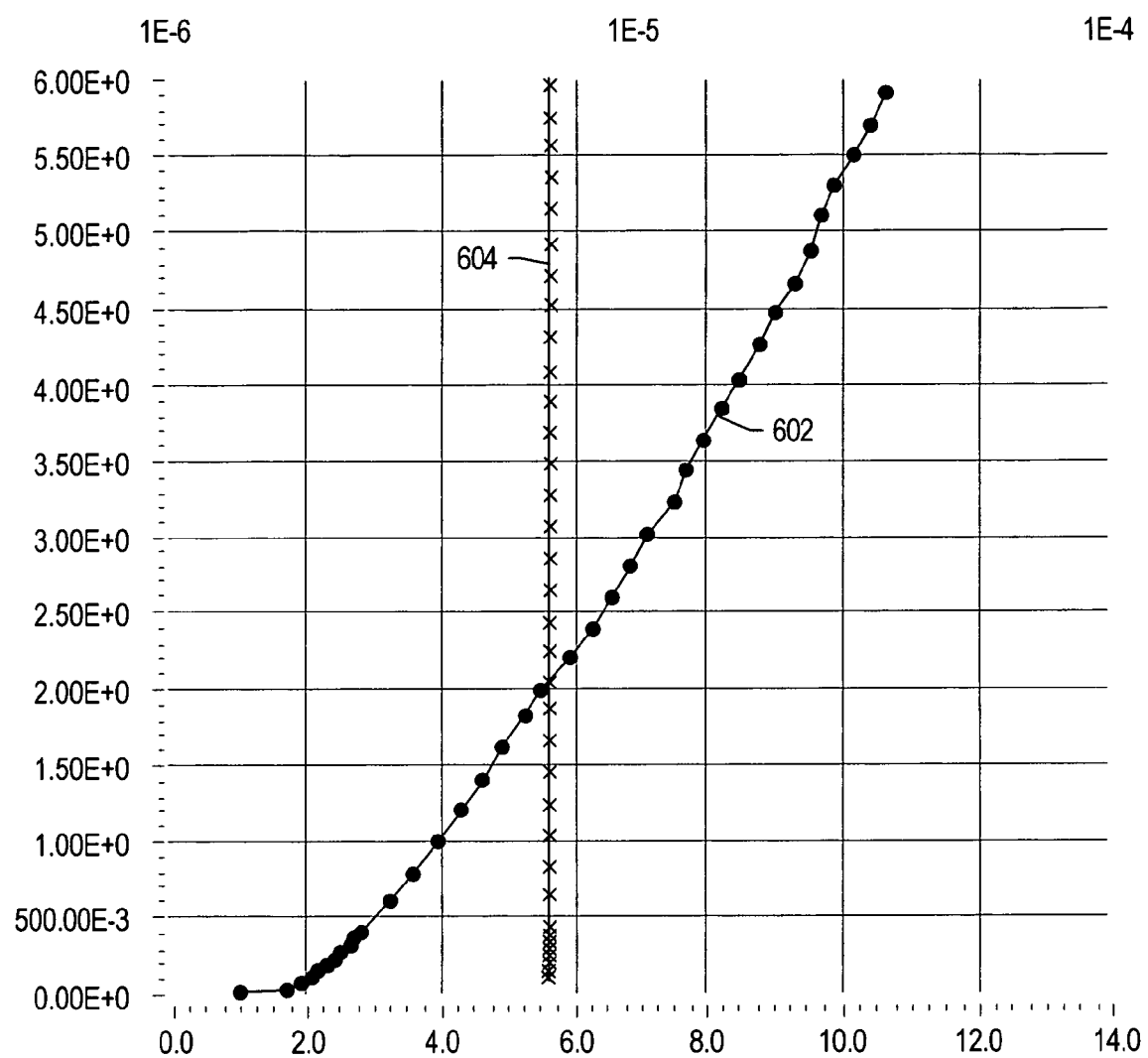
FIG. 6 shows a plot representing TLP testing results for a third set of pins that use the ESD protection circuit of FIG. 3.

FIGS. 4 through 6 provide examples of transition line pulse (TLP) testing results for pins that are coupled to a protection circuit such as PMOS protection circuit 300. More specifically, FIGS. 4, 5, and 6 represent the characteristic responses of various combinations of pins using PMOS protection circuit 300. Curves 402, 502, and 602 represent an I-V (current-voltage) characteristic curve with the bottom horizontal axis representing voltage, and the vertical axis representing device current. Curves 404, 504, and 604 represent a leakage evolution plot, where for each I-V data point measurement a simple direct current (DC) leakage measurement is performed on the pin/protection circuit being tested. The DC leakage value is represented on the top horizontal axis and may be obtained for a specified DC bias, plotted as a function of the current represented on the vertical axis. The near-linear behavior of I-V curves 402, 502 and 602, and DC leakage curves 404, 504, and 604 indicate that PMOS protection circuit 300 reliably triggers and withstands approximately 6 Amps of pulsed current.

FIG. 5 may be considered to provide a more generic characteristic of the response of PMOS protection circuit 300 as it is based on a pulse reaching from one analog pad to another. In the examples shown, the pulse pins coupling to PMOS protection circuit 300 comprise a data pin (7) in FIG. 4, enable pin (3) in FIG. 5, and analog pin (4) in FIG. 6. The test parameters for each of FIGS. 4, 5, and 6 include a leakage test voltage of 0.5V, maximum pulse voltage of 250V, test step voltage of 1V, and pulse width of 100 ns. The pulse current limit is 6 A in case of FIGS. 4 and 6, and 5 A in the case of FIG. 5.

Thus, various embodiments of the systems and methods described above may facilitate the design of effective ESD protection circuits that are tolerant of rail voltages exceeding the breakdown voltage of the semiconductor devices used in implementing the ESD protection circuit, utilizing a single trigger drive circuit that comprises a single n-well, thereby minimizing the amount of required silicon area during fabrication of the circuit.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A circuit for protecting against ESD, the circuit comprising:
   a plurality of p-channel field effect transistors (FETs) coupled in series and configured in a common n-well to form a switchable current sink, wherein the switchable current sink is coupled to a positive ESD clamp rail voltage;
   a control circuit coupled to a control connection of the switchable current sink, the control circuit configured to couple the control connection to a negative ESD clamp rail voltage, wherein a voltage drop from the control connection to the negative ESD clamp rail voltage is lower than a threshold voltage of an n-channel field effect transistor when an ESD event occurs on the positive ESD clamp rail voltage; and
   a voltage divider circuit coupled to the switchable current sink for dividing down the positive ESD clamp rail voltage;
   wherein the control circuit comprises a gate drive circuit coupled to a respective gate of each of the plurality of p-channel FETs coupled in series, wherein the gate drive circuit is configured to couple each respective gate to the negative ESD clamp rail voltage during the ESD event; and
   wherein the gate drive circuit comprises:
      a level shifting inverter having a supply terminal coupled to the positive ESD clamp rail voltage and a reference terminal coupled to the negative ESD clamp rail voltage;
      a trigger circuit configured to control the level shifting inverter; and
      a pull down circuit coupled to an output of the level shifting inverter;
      wherein the level shifting inverter is configured to turn on the switchable current sink via the pull down circuit during the ESD event.

2. The circuit of claim 1, wherein the positive ESD clamp rail voltage is a supply voltage and/or the negative ESD clamp rail voltage is ground.

3. A circuit for protecting against ESD, the circuit comprising:
   a switchable current sink comprising a plurality of transistors coupled in series, wherein the switchable current sink is coupled to a positive ESD clamp rail;
   a control circuit coupled to a control connection of the switchable current sink, the control circuit configured to couple, without an appreciable voltage drop, the control connection to a negative ESD clamp rail when an ESD event occurs on the positive ESD clamp rail; and
   a voltage divider circuit coupled to the switchable current sink for dividing down a voltage seen at the positive ESD clamp rail;
   wherein the control circuit comprises a gate drive circuit coupled to a respective gate of each of the plurality of transistors coupled in series, wherein the gate drive circuit is configured to couple each respective gate to the negative ESD clamp rail during the ESD event;
   wherein the gate drive circuit comprises:
   a pull down circuit;
   a trigger circuit coupled to the pull down circuit; and
   a level shifting inverter having a supply terminal coupled to the positive ESD clamp rail voltage and a reference terminal coupled to the negative ESD clamp rail voltage, the level shifting inverter coupled to the trigger circuit and to the pull down circuit, wherein the level shifting inverter is configured to turn on the switchable current sink via the pull down circuit during the ESD event, the pull down circuit thereby coupling each respective gate to the negative ESD clamp rail during the ESD event.

4. The protection circuit of claim 3, wherein the pull down circuit comprises at least one n-channel transistor coupled to a gate of one of the plurality of transistors coupled in series.

5. The protection circuit of claim 3, wherein the level shifting inverter comprises at least two cascaded p-channel FETs configured within a common n-well.

6. The protection circuit of claim 3, wherein the gate drive circuit further comprises an inverter coupled between the trigger circuit and the level shifting inverter.

7. A protection circuit for protecting against electrostatic discharge (ESD), the protection circuit comprising:
   a switchable current sink having a first control node and a second control node, and providing a discharge path between a positive ESD clamp rail and a negative ESD clamp rail, the discharge path capable of sinking substantially large currents when activated;
   a transistor device having a channel coupled between the first control node and the negative ESD clamp rail, wherein the transistor device couples the first control node to the negative ESD clamp rail when turned on, to activate the switchable current sink;

a first control circuit coupled between the positive ESD clamp rail and the first control node, and further coupled to an internal control node, wherein the first control circuit develops a first voltage level at the internal control node in response to a rapidly rising voltage on the positive ESD clamp rail;

a second control circuit coupled between the positive ESD clamp rail and the first control node, and further coupled to the internal control node and the second control node, wherein the second control circuit couples the first control node to the second control node when the internal control node reaches the first voltage level; and a third control circuit coupled between the positive ESD clamp rail and the negative ESD clamp rail, and further coupled to the first control node, the second control node, and a control terminal of the transistor device, wherein the third control circuit turns on the transistor device when the first control node is coupled to the second control node, wherein a voltage drop across the channel of the transistor device when the transistor device is turned on is less than a threshold voltage of the transistor device.

8. The protection circuit of claim 7, wherein the switchable current sink comprises a plurality of p-channel field effect transistors (FETs) coupled in series between the positive ESD clamp rail and the negative ESD clamp rail, wherein the first control node and the second control node comprise respective gate terminals of the plurality of p-channel FETs.

9. The protection circuit of claim 7, wherein the first control circuit comprises:

a capacitive element coupled between the positive ESD clamp rail and the internal control node; and a resistive element coupled between the internal control node and the first control node.

10. The protection circuit of claim 7, wherein the first control circuit comprises:

an inverter circuit having a pair of supply terminals respectively coupled to the positive ESD clamp rail and the negative ESD clamp rail, the inverter circuit having an input, and further having an output coupled to the internal control node;

a resistive element coupled between the positive ESD clamp rail and the input of the inverter circuit; and a capacitive element coupled between the input of the inverter circuit and the first control node.

11. The protection circuit of claim 7, wherein the second control circuit comprises:

an inverter circuit having a pair of supply terminals respectively coupled to coupled to the positive ESD clamp rail and the first control node, the inverter circuit having an input coupled to the internal control node, and further having an output coupled to the second control node.

12. The protection circuit of claim 11, wherein the inverter circuit comprises:

a p-channel field effect transistor (FET) having a channel coupled between the positive ESD clamp rail and the second control node, and further having a gate terminal coupled to the internal control node; and an n-channel FET having a channel coupled between the second control node and the first control node, and further having a gate terminal coupled to the internal control node;

wherein the first voltage level is sufficiently high to turn on the n-channel FET, which couples the first control node to the second control node.

13. The protection circuit of claim 7, wherein the transistor device is an n-channel field effect transistor (FET) having a gate terminal coupled to an output of the third control circuit, wherein a voltage level at the output of the third control circuit rises to a sufficiently high voltage level to turn on the n-channel FET when the first control node is coupled to the second control node.

14. The protection circuit of claim 7, further comprising a voltage divider circuit configured to establish a stable voltage level at the first control node during normal operation, wherein the stable voltage level is a mid-level voltage between a voltage level of the positive ESD clamp rail and a voltage level of the negative ESD clamp rail.

15. The protection circuit of claim 7, wherein a voltage level of the positive ESD clamp rail is a supply voltage and a voltage level of the negative ESD clamp rail is ground.

16. The protection circuit of claim 7, wherein the first control circuit, the second control circuit, and the third control circuit are configured in a single n-well.

17. The protection circuit of claim 7, wherein the rapidly rising voltage on the positive ESD clamp rail is a result of an ESD event.

18. The protection circuit of claim 7, wherein the third control circuit comprises:

a first and a second p-channel field effect transistor (FET) having their channels coupled in series between the positive ESD clamp rail and the control terminal of the transistor device, wherein a gate terminal of the first p-channel FET is coupled to the second control node and a gate terminal of the second p-channel FET is coupled to the first control node; and an n-channel FET having its channel coupled between the control terminal of the transistor device and the negative ESD clamp rail, and further having a gate terminal coupled to the first control node.

19. A method for protecting a system against electrostatic discharge (ESD) event on a power supply rail used to provide power to the system, the method comprising:

developing a stable voltage level at a first control node of a switchable current sink, wherein the stable voltage level is a mid-level voltage between a voltage level of the power supply rail and a voltage reference rail;

developing a first voltage level at an internal control node in response to a rapidly rising voltage on the power supply rail;

pulling a second control node of the switchable current sink to the stable voltage level in response to said developing the first voltage level;

turning on a first transistor device in response to said pulling the second control node to the stable voltage level;

the first transistor device pulling the first control node and the second control node to the voltage reference rail in response to said turning on the transistor device; and the switchable current sink providing a discharge path between the power supply rail and the voltage reference rail in response to said pulling the first control node and the second control node to the voltage reference rail.

20. The method of claim 19, wherein said providing a discharge path between the power supply rail and the voltage reference rail comprises sinking substantially large currents.

21. The method of claim 19, wherein the rapidly rising voltage on the power supply rail is a result of an ESD event.

22. The method of claim 19, wherein said pulling the second control node to the stable voltage level comprises turning on a second transistor device having a channel coupled between the first control node and the second control node.

23. The method of claim 19, wherein said pulling the second control node to the stable voltage level comprises establishing a signal path connecting the first control node to the second control node.

24. An ESD protection circuit comprising:
a switchable current sink having a first and a second control node, and comprising a plurality of transistors coupled in series, wherein the switchable current sink is coupled to a power supply rail, and wherein the first control node resides at a mid-level voltage between a voltage level of the power supply rail and a voltage reference rail during normal operation; and
a control circuit coupled to the first control node and the second control node, and configured to:
develop a first voltage level at an internal control node in response to a rapidly rising voltage on the power supply rail;
pull the second control node to the stable voltage level in response to the first voltage level developed at the internal node; and
turn on a first transistor device in response to the second control node being pulled to the stable voltage level, the first transistor device in turn pulling the first control node and the second control node to the voltage reference;
wherein the switchable current sink is configured to provide a discharge path between the power supply rail and the voltage reference rail in response to the first control node and the second control node of the switchable current sink being pulled to the voltage reference rail.

25. The ESD protection circuit of claim 24, wherein the rapidly rising voltage on the power supply rail is a result of an ESD event.

26. The ESD protection circuit of claim 24, wherein to pull the second control node of the switchable current sink to the stable voltage level in response the first voltage level developed at the internal node, the control circuit is configured to turn on a second transistor device having a channel coupled between the first control node and the second control node.

27. The ESD protection circuit of claim 24, wherein to pull the second control node to the stable voltage level in response to the first voltage level developed at the internal node, the control circuit is configured to establish a signal path connecting the first control node to the second control node.

28. The ESD protection circuit of claim 24, further comprising a voltage divider circuit coupled to the switchable current sink and between the power supply rail and the voltage reference rail, and configured to develop the mid-level voltage at the first control node during normal operation.

* * * * *